United States Patent [19]

Quirk et al.

[11] Patent Number: 5,846,330
[45] Date of Patent: Dec. 8, 1998

[54] GAS INJECTION DISC ASSEMBLY FOR CVD APPLICATIONS

[75] Inventors: George Quirk, Valley Village; Daniel V. Raney, Mission Viejo; Michael Scott Heuser, Foothill Ranch; C. B. Shepard, Jr., Laguna Niguel, all of Calif.

[73] Assignee: Celestech, Inc., Irvine, Calif.

[21] Appl. No.: 883,020

[22] Filed: Jun. 26, 1997

[51] Int. Cl.$^6$ .................................................. C23C 16/00
[52] U.S. Cl. .................................... 118/723 DC; 118/715; 219/74; 219/76.16; 219/121.15; 219/121.33; 219/121.36; 219/121.55; 204/298.15
[58] Field of Search ...................... 118/723 HC, 723 DC, 118/715; 219/73.11, 76.16, 74, 76.1, 76.14, 121.15, 121.33, 121.36, 121.47, 121.55, 121.59; 204/298.15

[56] References Cited

U.S. PATENT DOCUMENTS

| | | | |
|---|---|---|---|
| 4,019,091 | 4/1977 | Schoenmakers | 315/111.8 |
| 4,728,863 | 3/1988 | Wertheimer | 315/111.21 |
| 4,957,062 | 9/1990 | Schuurmans et al. | 118/723 DC |
| 5,188,671 | 2/1993 | Zinck et al. | 118/715 |
| 5,204,145 | 4/1993 | Gasworth | 427/577 |
| 5,256,205 | 10/1993 | Schmitt, III et al. | 118/723 |
| 5,342,660 | 8/1994 | Cann et al. | 427/577 |
| 5,571,332 | 11/1996 | Halpern | 118/723 HC |
| 5,746,834 | 5/1998 | Hanley | 118/715 |

FOREIGN PATENT DOCUMENTS

| | | | |
|---|---|---|---|
| 0295752 A1 | 12/1988 | European Pat. Off. | 118/723 DC |
| 61-143579 | 7/1986 | Japan | 118/723 DC |
| 5-58782 | 3/1993 | Japan | 118/723 DC |

*Primary Examiner*—Richard Bueker
*Assistant Examiner*—Jeffrie R Lund
*Attorney, Agent, or Firm*—David P. Gordon; David S. Jacobson; Thomas A. Gallagher

[57] ABSTRACT

A gas injection disc is provided which includes an outer ring and a tubular modular insert which slips into the outer ring. The outer ring is provided with an inner bore, a ring-shaped plenum located around the inner bore, an outer gas sealing surface around the plenum, and two gas feed paths extending from the periphery of the outer ring to the plenum. The gas feed paths are each provided with a gas feed attachment for coupling gas supply tubes thereto. The insert is provided with a plurality of radially aligned injectant holes, an inner gas sealing surface, and an axial bore. The insert is seated in the inner bore of the outer ring such that the inner and outer gas sealing surface face each other with a small gap provided therebetween which enables the insertion of the insert into the inner bore. The insert thereby substantially encloses the plenum, and the injectant holes are aligned with the plenum to receive injectant gases and direct the injectant gases into the axial bore of the insert. During the CVD process, the heat generated by the arc jet causes the insert to expand and eliminate the gap between the inner and outer sealing surfaces to thereby prevent undesirable gas leakage. Once the CVD operation is stopped the insert is permitted to cool and contract and return to its cooled dimensions unencumbered by the outer ring. The insert may then be removed for cleaning or for replacement with an insert having different characteristics.

20 Claims, 6 Drawing Sheets

GAS INJECTION DISC ASSEMBLY FOR CVD APPLICATIONS

BACKGROUND OF THE INVENTION

1. Field of the Invention

This invention relates broadly to a chemical vapor deposition system. More particularly, this invention relates to the gas injection disc in a plasma jet chemical vapor deposition system.

2. State of the Art

The utility for high quality thin diamond films for various applications is well known. Superior physical, chemical, and electrical properties make diamond films desirable for many mechanical, thermal, optical and electronic applications. For example, diamond has the highest room-temperature thermal conductivity of any material, a high electric field breakdown (~$10^7$ V/cm), and an air stable negative electron affinity. These properties make possible high power, high frequency transistors and cold cathodes, which cannot be made with any semiconductor other than diamond.

One method for producing thin diamond films is by using a chemical vapor deposition (hereinafter 'CVD') system. In CVD systems, a mixture of hydrogen and a gaseous hydrocarbon, such as methane, is activated and contacted with a substrate to produce a diamond film on the substrate. The hydrogen gas is disassociated into atomic hydrogen, which is then reacted with the hydrocarbon to form condensable carbon radicals including elemental carbon. The carbon radicals are then deposited on a substrate to form a diamond film. Some CVD methods use a hot filament, typically at temperatures up to 2000° C., to provide the thermal activation temperatures necessary to bring about the conversion described above. Other CVD methods use a plasma jet.

In some plasma jet methods, hydrogen gas is introduced into a plasma torch which produces a hydrogen plasma jet by means of a direct current arc (hereinafter "DC arc"), or an alternating current arc ("AC arc"), or microwave energy. The plasma torch is hot enough to reduce gases to their elemental form. However, the energy level of the plasma jet has a tendency to fluctuate. One method of stabilizing the energy level of the plasma is to utilize a vortex design in the CVD system. Tangential injection of the hydrogen gas into the arc processor may be used to impart the vortex to the hydrogen, in gaseous and atomic form.

The vortex design results in a controlled swirl of plasma. Hydrogen gas is introduced into the plasma jet and some of the hydrogen gas is thereby disassociated into monatomic hydrogen. The hydrogen (in both elemental and molecular states), swirling according to the swirl of the plasma, is forced through a downstream injector system which introduces jets of hydrocarbon needed to react with the elemental hydrogen to form diamond films.

Referring to FIG. 1, a prior art DC arc plasma jet system 10 is shown. The system includes an engine 11 having a hydrogen gas inlet 12, a cathode 14, an engine wall 16, an insulative lining 18 on the engine wall, and an anode 20. The system 10 further includes a gas injection disc 22, a nozzle 24 directed toward a substrate (not shown), and a vacuum chamber 25 which surrounds the engine 11, the gas injection disc 22, the nozzle 24, and the substrate.

Referring to FIGS. 1 and 2, the gas injection disc 22 is provided with a plurality of radially-positioned gas injectors 26a–26h (shown only with respect to 26a in FIG. 1), a toroidal plenum 27 surrounding the injectors 26a–h which feeds gas into the injectors, and two L-shaped gas injectant ports 28a, 28b (only 28a shown in FIG. 1) which radially feed gas into the plenum 27 from gas supply feeds (not shown) attached to the underside of the gas injection disc. The gas supply feeds must be attached to the underside of the gas injection disc, rather than to the periphery, because the space within the chamber 25 around the gas injection disc 22 is not sufficient to peripherally mount the gas supply feeds. In order to form each L-shaped port 28a, 28b to which the gas supply feeds are mounted, two holes must be drilled; one radial from the periphery of the gas injection disc and the other from underneath the gas injection disc to intersect the radial hole. The peripheral portion of the radial holes are plugged with sealing plugs 30a, 30b (only 30a shown in FIG. 1) to form the L-shaped port and then brazed to prevent gas leaks around the sealing plugs 30a, 30b. Bores 31a–d (only 31a shown in FIG. 1) permit mounting hardware (not shown) to extend from the nozzle 24 through the gas injection disc 22 to a support (not shown).

Referring to FIG. 2, which is a cross-section through the gas injection disc 22 of FIG. 1, the gas injection disc includes an inner cylindrical disc 32 having the gas injectors 26a–h bored therein and a central bore 34. A relatively larger outer ring 36 is provided with the injectant ports 28a, 28b and sealing plugs 30a, 30b. The inner disc 32 and outer ring 36 are brazed together (see FIG. 1) to form the composite gas injection disc 22. Referring to FIG. 3, and with reference to one injector 26a, each injector is machined to exacting tolerances to include a relatively large diameter inlet hole 38 and a relatively small diameter injection hole 40.

Referring now to prior art FIGS. 1 through 3, the hydrogen gas enters the hydrogen gas inlet 12 and is heated to a partial plasma state by an arc across the cathode 14 and the anode 20. The arc is controlled by solenoids (not shown) surrounding the engine 11. The tangential injection of the hydrogen contains the plasma and imparts the vortex swirl to the plasma. Downstream, hydrocarbon injectant and carrier hydrogen gas enter from the gas supply feed into the injectant ports 28a, 28b, and out of the injectors 26a, 26b into the central bore 34. The injectant mixes and reacts with the hydrogen plasma in the central bore 34, resulting in a mixture of molecular hydrogen, atomic hydrogen and carbon radicals which exits through the nozzle 24.

During the CVD process and during cooling after the CVD arc jet has been turned off, temperature gradients approaching 1000° C. across the radius of the injection disc 22 can have destructive effects on the integrity of the gas injectors 26a–h. The stresses of these extreme operating conditions during extended usage can be detrimental to the injection disc and lead to cracking. Moreover, during the cooling of the injection disc, hoop stress is imposed on the inner disc 32 during the cooling down period. That is, the inner disc 32 cools and contracts but is held in tension by the larger outer ring 36 which remains for a longer period of time at a higher temperature. When the thermally induced stresses exceed the tensile strength of the material, cracking results. Repeated stresses cause cracks which ultimately propagate into the plenum 27 and disrupt injection and mixing. Cracks therefore render the injectors 26a–h unreliable, unusable, and unrepairable.

Another problem with the prior art gas injection disc is that the braze work required to form the inner disc 32 and outer ring 34 into a composite unit is a long process, sometimes requiring several months. Complicating matters is that even after several months of manufacturing time, the resulting gas injection disc can be unacceptable due to poor quality brazing. One common problem is leakage in the gas injection disc at the braze joint between the outer ring and inner disc and at the braze joint between the gas injectant ports and sealing plugs.

Furthermore, because prior art gas injection discs are brazed together from an inner disc and an outer ring, when cracking occurs in either the disc or ring, the entire gas injection disc must be replaced.

Another problem with brazed gas injection discs is that they are unsuitable for experimentation due to their lack of flexibility. In particular, when it is desired to change the size or pattern of the injection holes of the injectors, the entire brazed assembly must be replaced. As such, an expensive collection of differently configured injector discs must be maintained on hand for typical experimental programs.

SUMMARY OF THE INVENTION

It is therefore object of the invention to provide a gas injection disc which does not require brazing.

It is another object of the invention to provide an injection disc which will not crack due to hoop stress.

It is a further object of the invention to provide a gas injection disc which can be easily repaired.

It is an additional object of the invention to provide a gas injection disc which is easily customizable for experimentation.

It is also an object of the invention to provide a gas injection disc which is relatively inexpensive to manufacture and can be manufactured relatively quickly.

In accord with these objects, a gas injection disc is provided which includes an outer ring and a tubular modular insert which slips into the outer ring. The outer ring is provided with an inner bore, a ring-shaped plenum located around the inner bore, an outer gas sealing surface having portions above and below the plenum, and preferably at least two gas feed paths extending from the periphery of the outer ring to the plenum. The gas feed paths are each provided with a gas feed attachment for coupling gas supply tubes thereto. The insert is provided with a plurality of radially aligned injectant holes, an inner gas sealing surface, and an axial bore. The insert is seated in the inner bore of the outer ring such that the inner and outer gas sealing surface face each other with a small gap provided therebetween which enables the insertion of the insert into the inner bore. The insert thereby substantially encloses the plenum, and the injectant holes are centrally aligned with the plenum to receive injectant gases and direct the injectant gases into the axial bore of the insert.

During the CVD process, the heat generated by the arc jet causes the insert to expand and eliminate the gap between the inner and outer sealing surfaces to thereby prevent undesirable gas leakage. However, once the CVD operation is stopped, the insert is permitted to cool and contract and return to its cooled dimensions, thereby regenerating the small gap between the insert and the outer ring. The insert, unencumbered by the outer ring, may then be removed for cleaning or for replacement with an insert having different characteristics.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
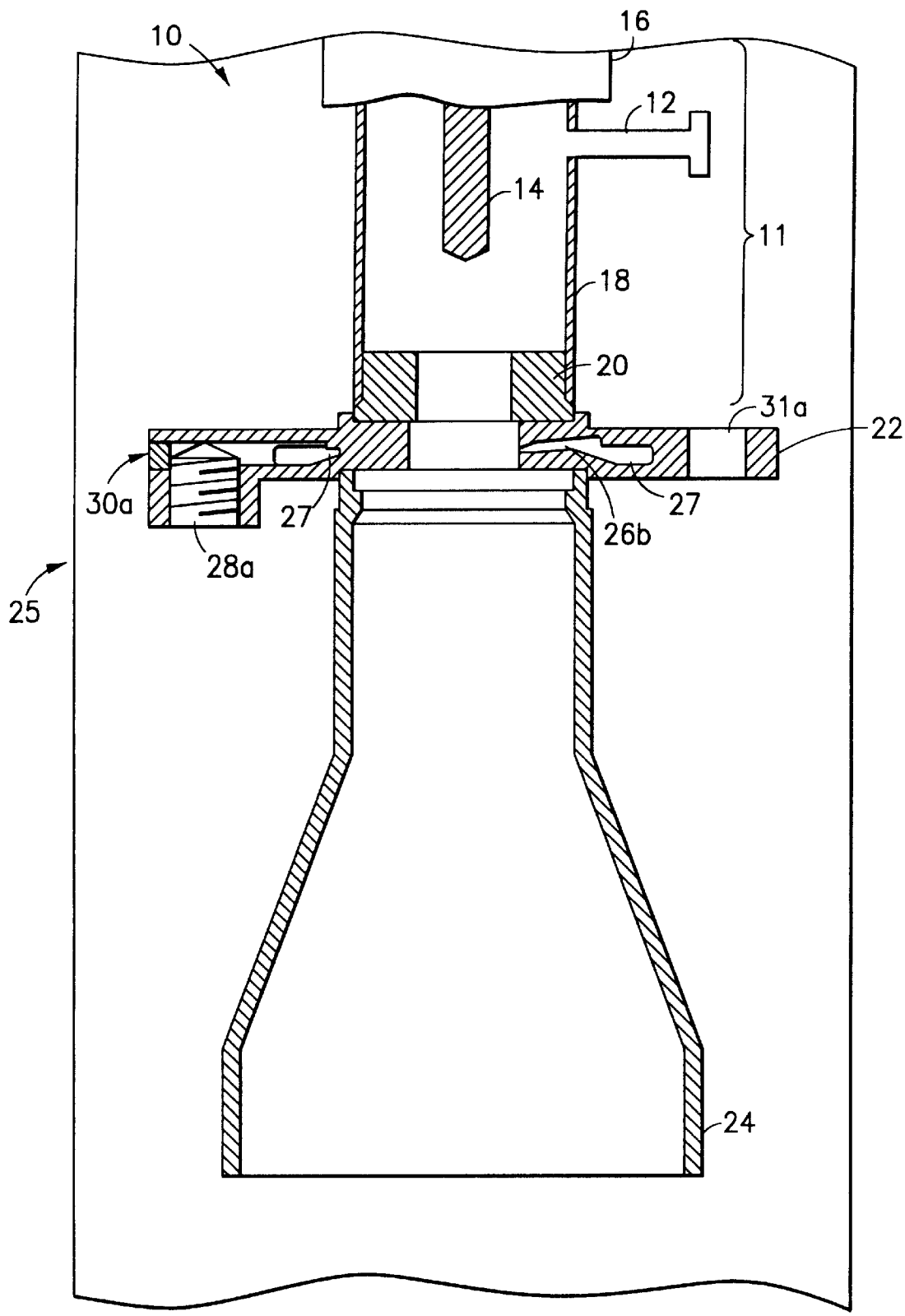
FIG. 1 is a broken 135°-sectional (as indicated by line 1—1 in FIG. 2) view of the prior art plasma injection system.
Figure 2:
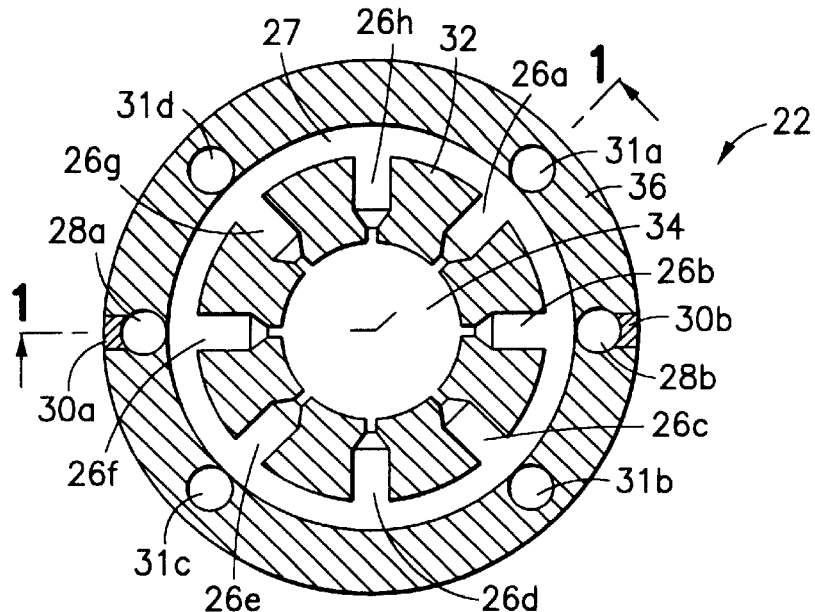
FIG. 2 is a cross-section through the prior art gas injection disc.
Figure 3:
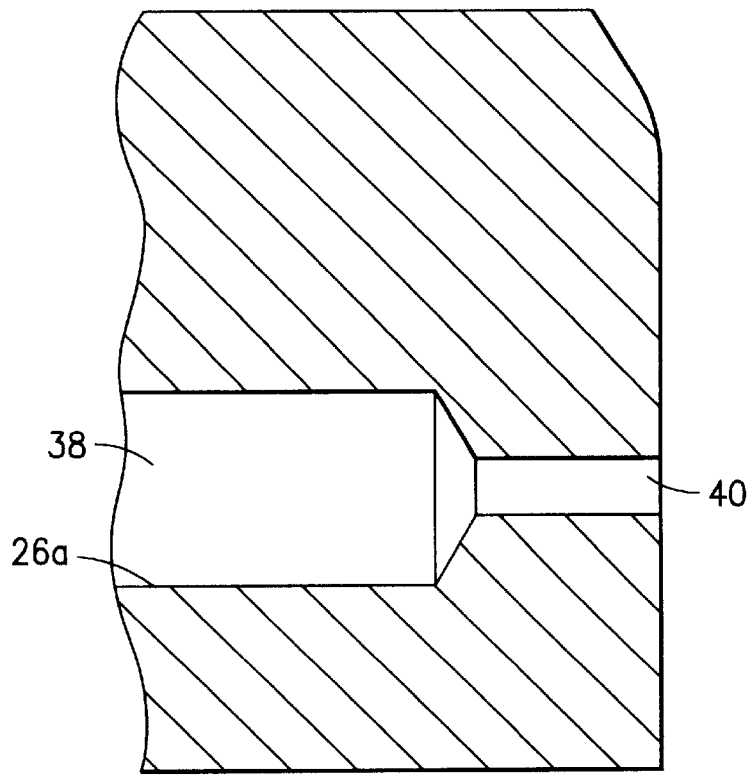
FIG. 3 is a broken sectional view of the prior art injector design.
Figure 4:
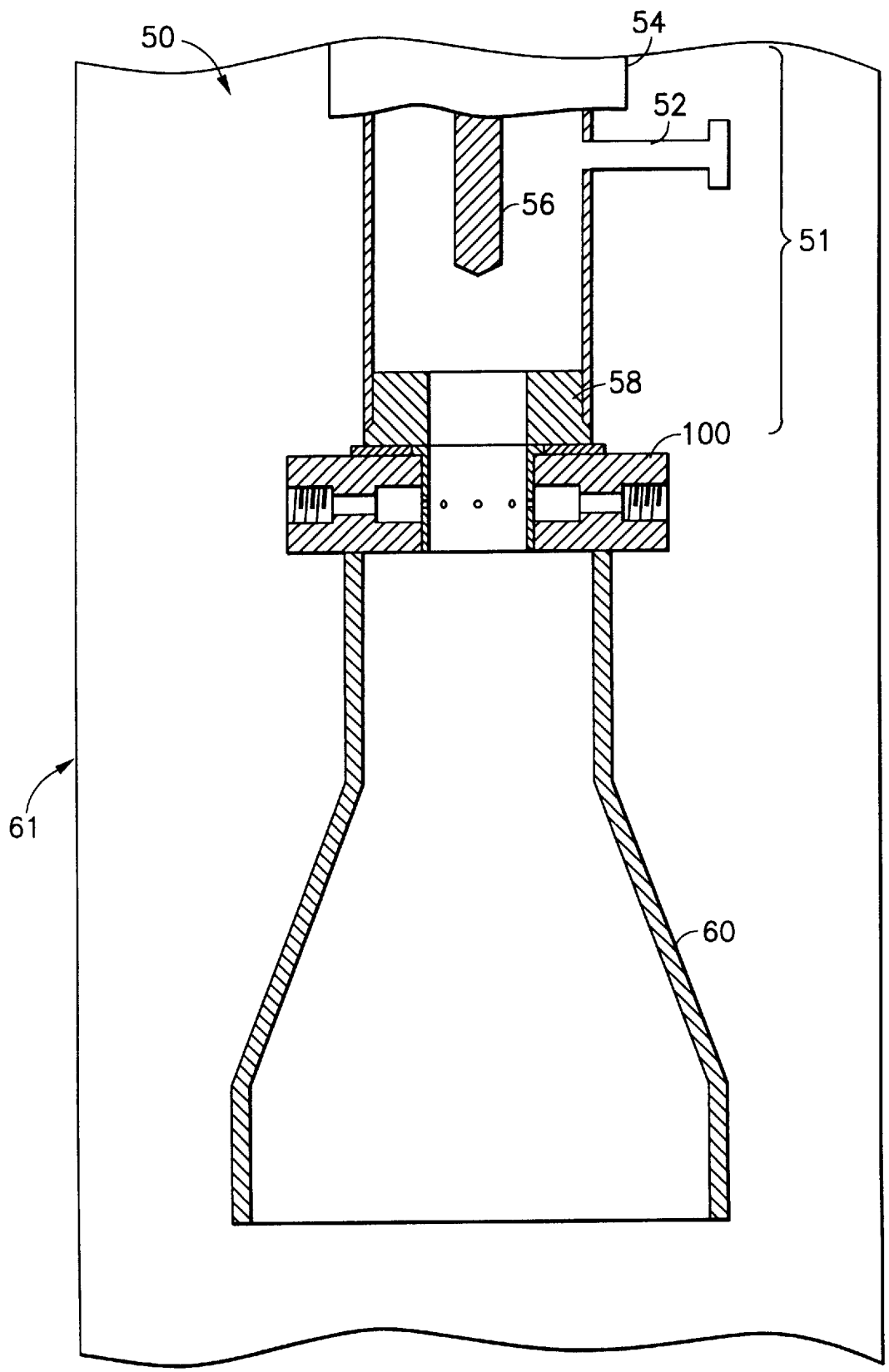
FIG. 4 is a broken sectional view of a plasma injection system according to the invention.

Referring to FIG. 4, a plasma jet system 50 for a plasma jet CVD system includes an engine 51 having an engine wall 54, a hydrogen gas inlet 52 for the passage of hydrogen gas through the engine wall 54, a cathode 56 located at an upper portion of the engine 51, and an anode 58 located at the bottom portion of the engine 51. The modular gas injection disc 100 of the invention is positioned adjacent the anode 58, and the nozzle 60 is positioned under the gas injection disc. A vacuum chamber 61 surrounds the engine 11, the gas injection disc 100, the nozzle 60, and a substrate (not shown) located beneath and in the path of the nozzle.

Hydrogen gas enters the hydrogen gas inlet 52 and is heated into a plasma jet by an arc across the cathode 56 and the anode 58. The arc is controlled by solenoids (not shown) surrounding the engine wall 54. The injection of the hydrogen gas and the applied magnetic field contain the plasma and impart a vortex swirl to the plasma. From the gas injection disc assembly 100 hydrocarbon and carrier hydrogen gas are injected into the plasma swirl, forming a reactant mixture of hydrocarbon and hydrogen. The reactant mixture flows out through a nozzle 60, where a reactant mixture of hydrocarbon and hydrogen is directed toward the substrate.

Figure 5:
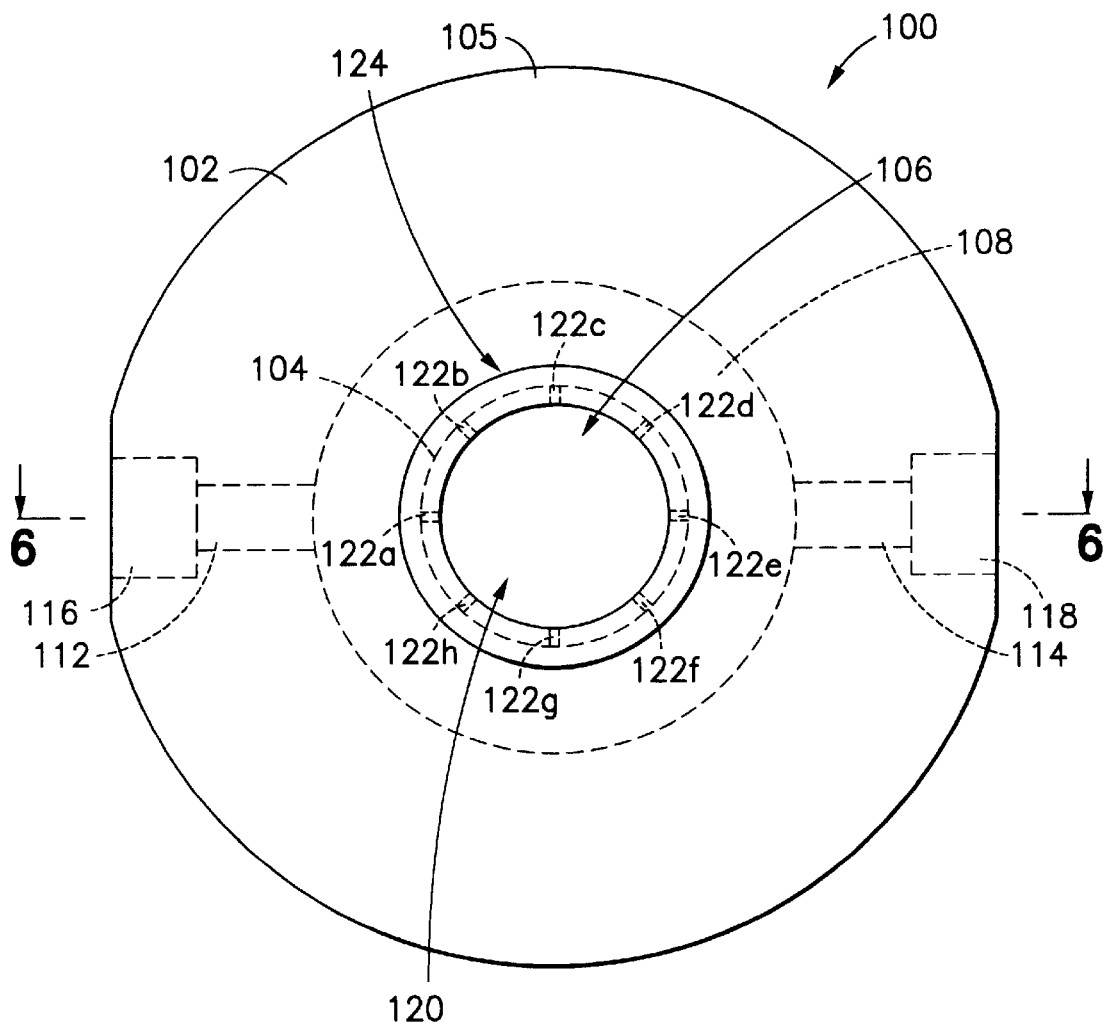
FIG. 5 is a transparent top view of a first embodiment of a gas injection disc assembly according to the invention.
Figure 6:
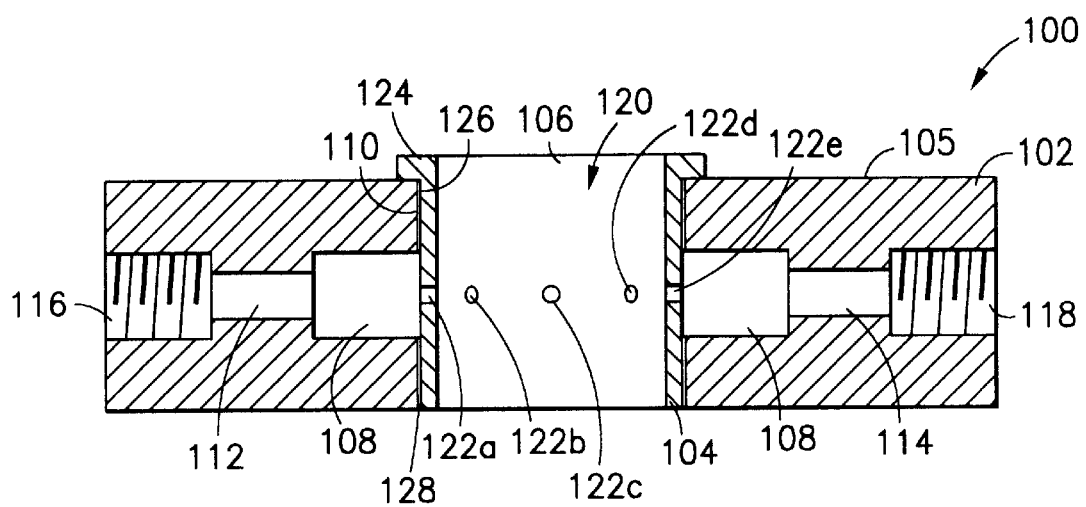
FIG. 6 is a cross-section through line 5—5 in FIG. 4.

Turning now to FIGS. 5 and 6, the gas injection disc assembly 100 generally includes an outer ring 102 and a tubular modular insert 104 which slips into the outer ring. The outer ring 102 and insert 104 are preferably both made of a titanium zirconium molybdenum (TZM) alloy. Other materials can be used for the outer ring and insert, although preferably the coefficient of expansion of the material used for the outer ring is substantially equal to the coefficient of expansion of the material used for the insert.

According to a first preferred embodiment, the outer ring 102 is provided with an upper surface 105, a ring-shaped plenum 108 located around an inner bore 106, two diametrically opposed gas feed paths 112, 114 (injector bodies) extending from the periphery of the outer ring to the plenum 108, and an outer gas sealing surface 110 having portions above and below the plenum 108. The gas feed paths 112, 114 are each provided with a coaxial gas feed attachment points 116, 118 (e.g., an internal thread) for coupling gas supply tubes (not shown) thereto. The insert 104 is provided with an axial bore 120, a plurality of radially-aligned and cylindrically-bored injectant holes 122a–h, an upper lip 124, and an inner gas sealing surface 126.

The insert 104 is seated in the inner bore 106 of the outer ring 102 such that the upper lip 124 of the insert 104 rests on the upper surface 105 of the outer ring. The inner and outer gas sealing surfaces 110, 126 thereby face each other such that a small gap 128 (FIG. 6) is provided therebetween. The insert 104 thereby substantially encloses the plenum 108, and the injectant holes 122a–e are aligned with the plenum 108 to receive injectant gases and to direct the injectant gases into the axial bore 120 of the insert.

According to a preferred embodiment of the invention, the outer ring 102 preferably has a maximum outer diameter of approximately three and one-quarter inches and an inner bore 106 diameter of approximately one inch. The insert 104 preferably has an outer diameter (at the inner sealing surface 126) of approximately one inch, and the diameter of the axial bore 120 is approximately three-quarter inches. The size of the outer diameter of the insert is dependent on the size of the diameter of the inner bore outer ring. The size of the bores are application dependent and can vary. Likewise, the size, number, and configuration of injector holes are determined by the desired volumetric flow rate of injectant gases for a particular application. It will be appreciated by those skilled in the art that exact dimensions, close tolerances, and polished inner and outer sealing surfaces provide the capability of the self-sealing modular gas injection disc assembly of the invention, as described below.

Figure 7:
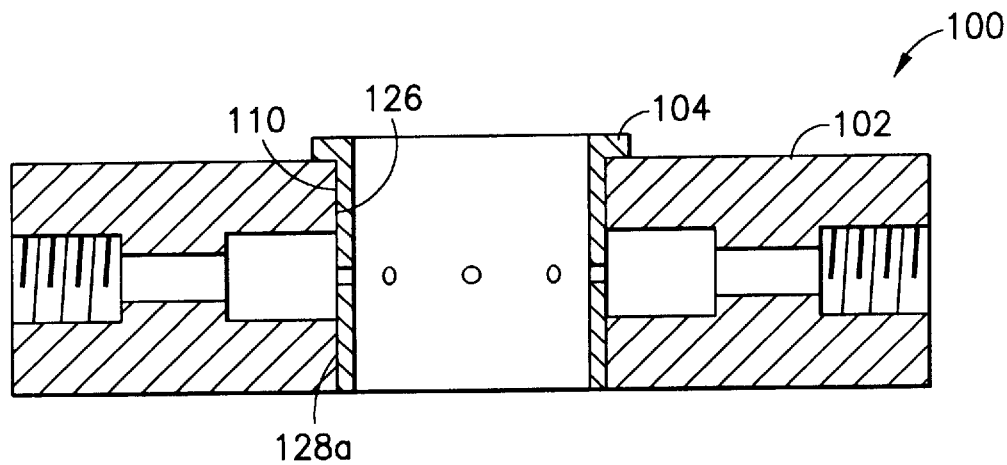
FIG. 7 is a view similar to FIG. 5 in which the gas injection disc assembly is in a heated state.

During the CVD process, heat is generated by the plasma arc jet and concentrated on the insert 104. As a result, and as seen in FIG. 7, the insert expands and eliminates the gap (shown as 128 in FIG. 6) between the inner and outer sealing surfaces 110, 126. The inner and outer sealing surfaces make contact at 128a (FIG. 7) thereby self-sealing the gas injection disc assembly. A hydrocarbon injectant gas is fed through gas supply tubes (not shown) into the gas feed paths 112, 114, and fills the plenum 108. The contact 128a between the inner and outer gas sealing surfaces 110, 126 prevents undesirable gas leakage between the plenum and the insert. The gas then flows out of the injectant holes 122a–h in a direction perpendicular to the axis of the bore 120, and mixes with the hydrogen plasma, according to the CVD process as described above in the Background of the Invention. Once the CVD operation is stopped, the insert 104 is permitted to cool and contract and return to its cooled dimensions (FIG. 5) unencumbered by the outer ring 102.

A number of advantages are realized with the gas injection disc assembly of the invention. First, because the insert is not brazed to the outer ring, the insert and outer ring may contract independently during cooling. As a result, the gas feed paths and injectant holes are not subject to the stresses responsible for cracking. Second, the gas injection disc assembly does not require the expensive, unreliable, and lengthy process of brazing for sealing the surfaces that form the gas plenum. Third, inspection and cleaning of the gas feed paths and injectant holes can be more thorough and accurate than with conventional injectors, as the insert can be removed. Injectant hole sizes can be checked using gauge pins entering from the plenum side, rather than from the axial bore side, ensuring that no debris or crystallized graphite deposits are pushed back into the injectant holes obstructing gas flow. The inserts are also easy to handle and precise measurements can be performed thereon using calipers and micrometers in locations that would otherwise be impossible to access. Moreover, it is relatively easy to remove the insert for cleaning in an ultrasonic bath. Fourth, the machining time for generating the gas injection disc of the invention is reduced to several days, rather than the typical several months required for a conventional gas injection disc. Fifth, because of the ease of removal of an insert and the low cost of an insert, relative to the cost of a conventional gas injection disc, the inserts may be replaced as soon as indications of normal wear become apparent. Sixth, due to the modular design of the insert, a variety of experimental versions of the inserts each having unique characteristic, e.g., having variations of injection hole location, size, and shape, can be utilized with minimal associated cost. Seventh, the gas injection disc can be made with a smaller diameter (up to one inch smaller) than possible in prior art designs. Therefore, room is provided in the vacuum chamber to peripherally mount the gas feed attachment means, thereby eliminating the need for L-shaped injectant ports and further eliminating the need for brazing potentially leaky sealing plugs at injectant ports.

Figure 8:
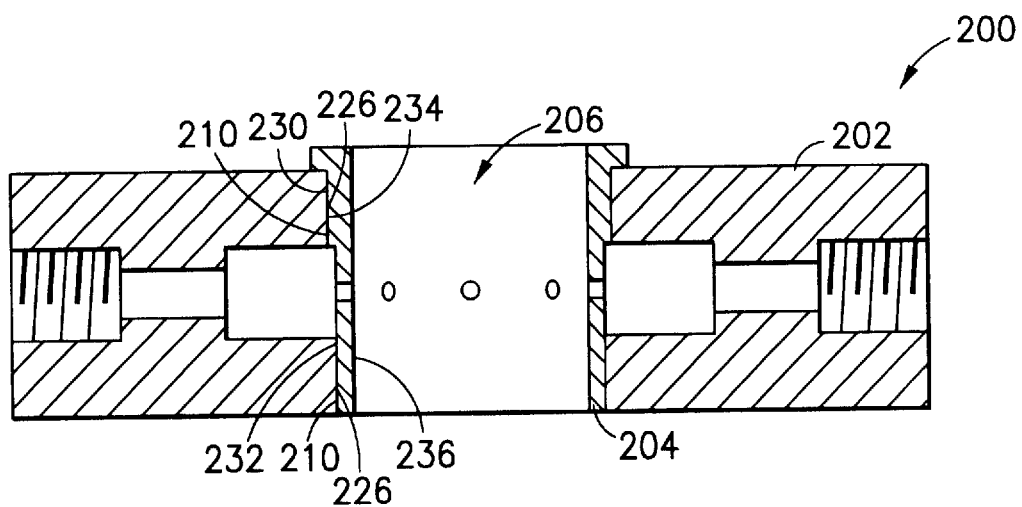
FIG. 8 is a view similar to FIG. 7 of a second embodiment of a gas injection disc assembly according to the invention.

Turning to FIG. 8, a second preferred embodiment of a gas injection disc assembly 200, substantially similar to the first embodiment (in which like parts have similar numbers incremented by 100), is shown. The outer ring 202 is provided with a stepped inner bore 206 defined by a stepped first sealing surface 210. The stepped first sealing surface 210 has an upper portion 230 of a particular height and diameter and a lower portion 232 of another height and diameter. The diameter of the stepped bore 206 at the upper portion 230 is greater than the diameter of the stepped bore at the lower portion 232. The insert 204 is correspondingly provided with a stepped peripheral second sealing surface 226 having an upper portion 234 and a lower portion 236; the upper portion 234 having a relatively larger outer diameter than the lower portion 236. The upper portion 234 of the sealing surface 226 of the insert 204 has substantially the same height and diameter as the upper portion 230 of the sealing surface 210 of the outer ring 202. The lower portion 236 of the sealing surface 226 of the insert 204 has substantially the same diameter as the lower portion of the outer ring 202. The lower portion of the second sealing surface has a height approximately equal to the height of the outer ring 202 less the height of the upper portion 234 of the second sealing surface 226. The stepped insert 204 has a reduced likelihood of binding during insertion into and removal from the stepped bore 206 of the outer ring 202 when residues associated with injectant may otherwise hinder the slip fit between the sealing surfaces 210, 226.

Figure 9:
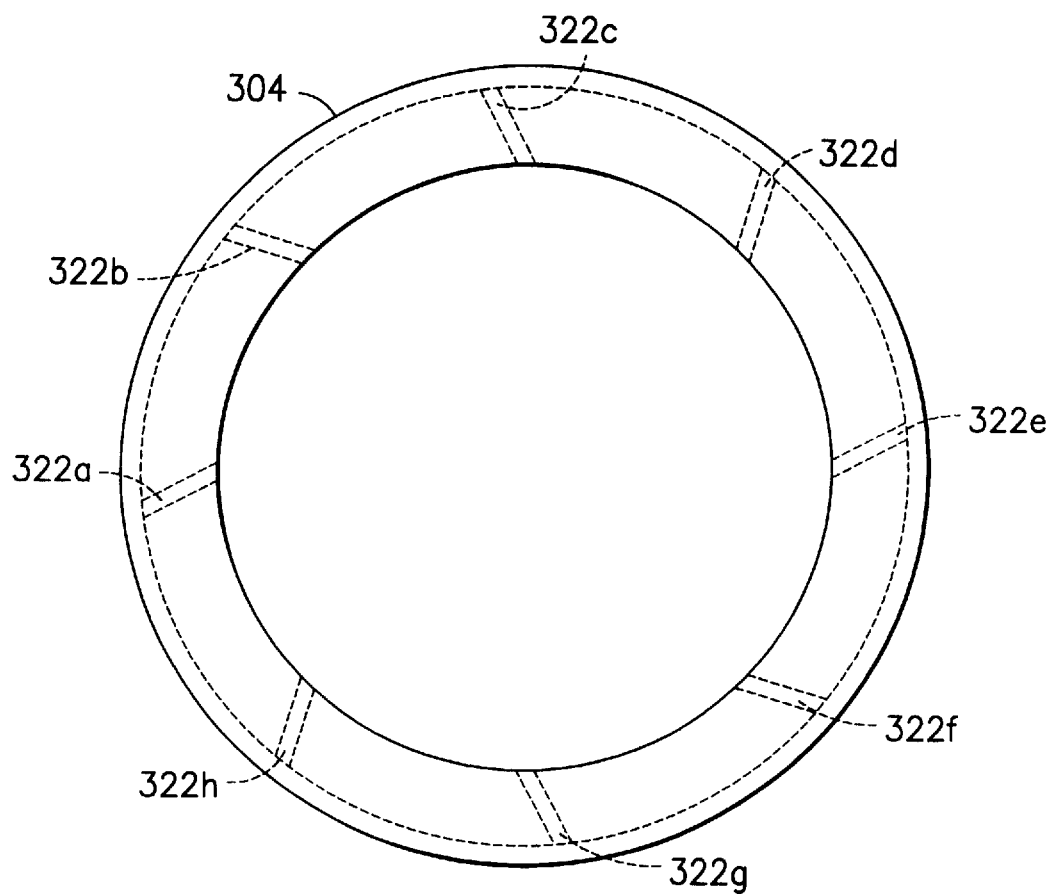
FIG. 9 is a partial view of an insert for a gas injection disc assembly according to a third embodiment of the invention.
Figure 10:
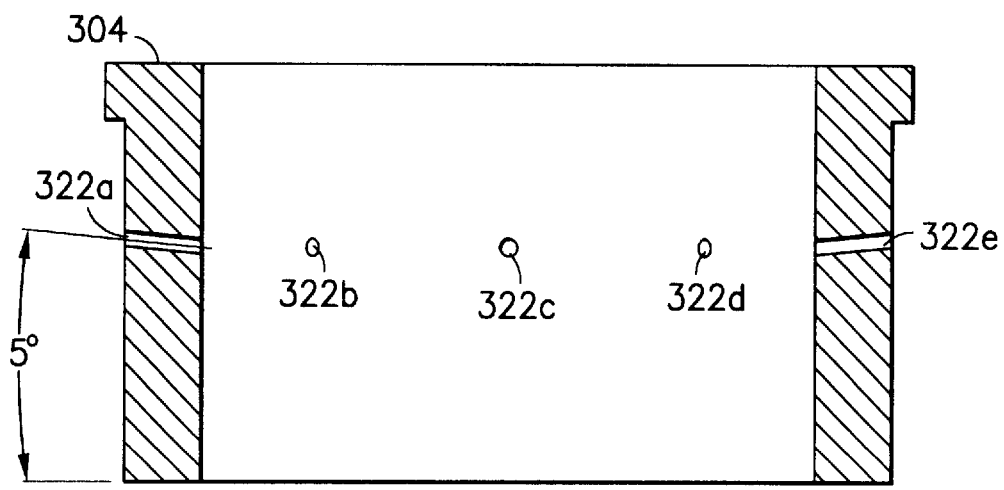
FIG. 10 is a section view of the insert of FIG. 9.

Turning now to FIGS. 9 and 10, a third preferred embodiment of the invention, substantially similar to the first embodiment (with like parts having numbers incremented by 200) is shown. As the outer ring is exactly as provided in the first embodiment, the outer ring is not shown. The insert 304 is provided with a plurality of injectant holes 322a–h which are non-radially aligned. Preferably the injectant holes are laterally angled, each by the same angle, to inject injectant counter to the swirl of the plasma. Preferred angles are 20° to 40°, with 30° being most preferable. In addition, the injectant holes 322a–h are angled relative to the horizontal. Preferably the injectant holes are angled downward by 1° to 10° (i.e., toward the nozzle), with 5° being most preferable.

There have been described and illustrated herein several embodiments of a gas injection disc assembly. While particular embodiments of the invention have been described, it is not intended that the invention be limited thereto, as it is intended that the invention be as broad in scope as the art will allow and that the specification be read likewise. Thus, while particular materials and dimensions have been disclosed, it will be appreciated that other materials and dimensions could be used as well. Furthermore while a particular stepped configuration for seating the insert in the inner bore of the ring has been disclosed, it will be appreciated that other configurations can be used as well. For example, and not by way of limitation, the insert may have a frustoconical or multi-stepped fit within the inner bore of the outer ring. Moreover, while a cylindrical bore perpendicular to the axis of the bore of the insert has been disclosed in reference to the injector holes, it will be appreciated that other configurations could be used as well. For example, the injector holes may be frustoconical in shape and/or angled other than perpendicular relative to the axial bore of the insert. In addition, while the several embodiment have disclosed various configurations of the insert (e.g., stepped and non-stepped inserts, radial and non-radial injectant holes, horizontally angled injectant holes, etc.), it will be appreciated that various combinations of the configurations (e.g., a stepped insert having non-radial and horizontally angled injectant holes) are intended by the disclosure of the invention. Furthermore, while the gas feed paths are shown to extend radially peripheral, it will be appreciated that the gas feed paths may alternatively be L-shaped. Moreover, while the gas injection disc assembly has been described with respect to a CVD arc jet plasma system for injecting hydrocarbons in the process of diamond film deposition, it will be appreciated that the gas injection disc assembly may be used for injecting gases other than hydrocarbons for making films other than diamond films. It will therefore be appreciated by those skilled in the art that yet other modifications could be made to the provided invention without deviating from its spirit and scope as so claimed.

What is claimed is:

1. A gas injection disc assembly for use with a plasma jet chemical vapor deposition system, comprising:

a) an outer ring body having an external surface, a first inner bore, a first gas sealing surface around said first inner bore, a ring-shaped open plenum in said outer ring body, said plenum located around and in fluid communication with said inner bore, said outer ring body defining a gas feed path from said external surface of said outer ring body to said plenum; and b) a first insert provided with a plurality of injectant holes, a second bore substantially coaxial with said first inner bore, and a second gas sealing surface, wherein said first insert is seated within said inner bore of said outer ring body such that said injectant holes face said plenum and said first gas sealing surface faces said second gas sealing surface.

2. A gas injection disc assembly according to claim 1, wherein:

said outer ring body and said first insert are adapted such that when said gas injection disc is in a cooled state, a gap is provided between said first and second gas sealing surfaces, said gap enabling the removal of said first insert from said outer ring body, and when said gas injection disc is in a heated state, said first and second gas sealing surfaces contact each other such that said second gas sealing surface seals said plenum.

3. A gas injection disc assembly according to claim 2, further comprising:

a second insert provided with a plurality of injectant holes, a second bore, and a second gas sealing surface, said first insert being replaceable by said second insert when said gas injection disc is in a cooled state.

4. A gas injection disc assembly according to claim 1, wherein:

said outer ring body is provided with an upper surface and said first insert is provided with a upper lip which seats against said upper surface when said first insert is seated in said first inner bore of said outer ring body.

5. A gas injection disc assembly according to claim 1, wherein:

said injectant holes are radially aligned.

6. A gas injection disc assembly according to claim 1, wherein:

said injectant holes are non-radial relative to a longitudinal axis of said second bore.

7. A gas injection disc assembly according to claim 1, wherein:

said injectant holes are not perpendicular relative to a longitudinal axis of said second bore.

8. A gas injection disc assembly according to claim 1, wherein:

said gas feed paths extend from said plenum to a radial periphery of said outer ring body.

9. A gas injection disc assembly according to claim 1, wherein:

said outer ring body is threaded around a peripheral portion of said gas feed path.

10. A gas injection disc assembly according to claim 1, wherein:

said first inner bore is stepped and said first insert has a stepped second gas sealing surface.

11. A gas injection disc assembly according to claim 1, wherein:

said outer ring and said first insert are made from a titanium zirconium molybdenum alloy.

12. A plasma jet chemical vapor deposition system for depositing a film on a substrate, comprising:

a) a gas inlet for introducing a gas into said system;

b) means for producing a plasma jet containing said gas;

c) a gas injection disc comprising an outer ring body and a first insert, said outer ring body having an external surface, a first inner bore, a first gas sealing surface around said first inner bore, a ring-shaped open plenum in said outer ring body, said plenum located around and in fluid communication with said inner bore, said outer ring body defining a gas feed path from said external surface of said outer ring to said plenum, and said first insert having a plurality of injectant holes, a second bore substantially coaxial with said first inner bore, and a second gas sealing surface, said first insert being seated within said inner bore of said outer ring body such that said injectant holes face said plenum and said first gas sealing surface faces said second gas sealing surface;

d) means for supplying injectant to said gas feed paths; and e) a nozzle through which said mixture flows and is deposited as a film on the substrate.

13. A plasma jet chemical vapor deposition system according to claim 12, wherein:

said outer ring body and said first insert are adapted such that when said gas injection disc is in a cooled state a gap is provided between said first and second gas sealing surfaces, said gap enabling the removal of said first insert from said outer ring body, and when said gas injection disc is in a heated state, said first and second gas sealing surfaces contact each other such that said second gas sealing surface seals said plenum.

14. A plasma jet chemical vapor deposition system according to claim 12, further comprising:

a second insert provided with a plurality of injectant holes, an axial bore, and a second gas sealing surface, said first insert being replaceable by said second insert when said gas injection disc is in a cooled state.

15. A plasma jet chemical vapor deposition system according to claim 12, wherein:

said outer ring body is provided with an upper surface and said first insert is provided with a upper lip which seats against said upper surface when said first insert is seated in said inner bore of said outer ring body.

16. A plasma jet chemical vapor deposition system according to claim 12, wherein:

said injectant holes are at least one of non-radial relative to a longitudinal axis of said second bore and non-perpendicular relative to a longitudinal axis of said second bore.

17. A plasma jet chemical vapor deposition system according to claim 12, wherein:

said gas feed paths extend from said plenum to a radial periphery of said outer ring body.

18. A plasma jet chemical vapor deposition system according to claim 17, wherein:

said outer ring body further includes gas feed attachment means for coupling said means for supplying gas to said gas feed paths, said gas feed attachment means being located at said radial periphery of said outer ring.

19. A plasma jet chemical vapor deposition system according to claim 12, wherein:

said first inner bore is stepped and said first insert has a stepped second gas sealing surface.

20. A plasma jet chemical vapor deposition system according to claim 12, wherein:

said outer ring and said first insert are made from a titanium zirconium molybdenum alloy.

* * * * *